(12) United States Patent
Natori et al.

(10) Patent No.: US 7,803,682 B2
(45) Date of Patent: Sep. 28, 2010

(54) SEMICONDUCTOR MEMORY DEVICE AND METHOD FOR MANUFACTURING SAME

(75) Inventors: Katsuaki Natori, Kanagawa-ken (JP); Masayuki Tanaka, Kanagawa-ken (JP); Akihito Yamamoto, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 298 days.

(21) Appl. No.: 11/892,282

(22) Filed: Aug. 21, 2007

(65) Prior Publication Data

US 2008/0054341 A1 Mar. 6, 2008

(30) Foreign Application Priority Data

Aug. 22, 2006 (JP) ............................. 2006-225492

(51) Int. Cl.
 *H01L 21/336* (2006.01)
(52) U.S. Cl. ................ 438/266; 257/314; 257/315; 257/316; 257/E21.202; 257/E21.204; 257/E27.004; 257/E27.103; 438/201; 438/211; 438/257
(58) Field of Classification Search ......... 257/314–320, 257/E21.202, 204, 683, E27.004, 103; 438/201, 438/211, 257, 260, 262, 266
See application file for complete search history.

(56) References Cited

U.S. PATENT DOCUMENTS

| | | | | |
|---|---|---|---|---|
| 6,229,175 B1 * | 5/2001 | Uchida | ....................... | 257/315 |
| 6,261,849 B1 * | 7/2001 | Lee | ................. | 438/3 |
| 6,459,111 B1 | 10/2002 | Natori et al. | | |
| 6,670,239 B2 * | 12/2003 | Yoon | ......................... | 438/257 |
| 6,881,616 B1 * | 4/2005 | Hellig et al. | ................. | 438/181 |
| 7,105,400 B2 | 9/2006 | Imai et al. | | |
| 2003/0042527 A1 | 3/2003 | Forbes et al. | | |
| 2005/0199938 A1 * | 9/2005 | Sakuma et al. | ............... | 257/314 |
| 2006/0006454 A1 * | 1/2006 | Wang | ......................... | 257/314 |
| 2006/0281330 A1 * | 12/2006 | Ahn et al. | .................... | 438/778 |
| 2007/0065961 A1 * | 3/2007 | Park et al. | ..................... | 438/43 |

FOREIGN PATENT DOCUMENTS

| | | |
|---|---|---|
| JP | 2000-260963 | 9/2000 |
| JP | 2001-298099 | 10/2001 |
| JP | 2002-289810 | 10/2002 |
| JP | 2005-197363 | 7/2005 |

OTHER PUBLICATIONS

Notification of Reason for Refusal issued by the Korean Patent Office on May 29, 2008, for Korean Patent Application No. 10-2007-083840, and English-language translation thereof.

* cited by examiner

*Primary Examiner*—Thao X Le
*Assistant Examiner*—Eric W Jones
(74) *Attorney, Agent, or Firm*—Finnegan, Henderson, Farabow, Garrett & Dunner, L.L.P.

(57) ABSTRACT

A semiconductor memory device includes a plurality of memory transistors. Each of the memory transistors has: a floating gate electrode; an interelectrode insulating film; and a control gate electrode. The floating gate electrode includes, in a cross section taken along a bit line direction, a first conductive film, first sidewall insulating films opposed to each other across the first conductive film, and a second conductive film provided on the first sidewall insulating films and the first conductive film. The interelectrode insulating film is provided on the second conductive film. The control gate electrode includes a third conductive film provided on the interelectrode insulating film and a fourth conductive film provided on the third conductive film.

16 Claims, 17 Drawing Sheets

SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2006-225492, filed on Aug. 22, 2006; the entire contents of which are incorporated herein by reference.

BACKGROUND OF THE INVENTION

1. Field of the Invention

This invention relates to a semiconductor memory device and a method for manufacturing the semiconductor memory device, and more particularly to a nonvolatile semiconductor memory device having floating gate electrodes.

2. Background Art

Recently, with the increasing density of large scale integrated circuits (LSI), the gate insulating film and capacitor insulating film used in semiconductor memory devices have been constantly thinned. As a countermeasure to avoid the increase of leak current associated with the thinning, the structure of semiconductor memory devices is subjected to changes such as three-dimensional configuration. On the other hand, attempts have been made to prevent the increase of leak current by using high dielectric constant insulating film to increase physical film thickness.

In particular, in nonvolatile semiconductor memory devices such as electrically erasable programmable read-only memories (EEPROM), an interpoly dielectric film (IPD) or other interelectrode insulating film serving as a charge storage layer formed between the floating gate electrode and the control gate electrode is based on a laminated film such as silicon oxide ($SiO_2$) film/silicon nitride ($Si_3N_4$) film/$SiO_2$ film (ONO film) to increase dielectric constant. Furthermore, attempts are also made to apply a three-dimensional structure for increasing the area of the interelectrode insulating film. However, with the decrease of distance between memory cells in nonvolatile semiconductor memory devices, intercell interference is significantly increased due to lateral opposing capacitance between the floating gate electrodes of adjacent memory cells, causing write errors and degrading memory characteristics. Hence it is difficult to increase the area using three-dimensional structures.

For realizing next-generation nonvolatile semiconductor memory devices, the interelectrode insulating film needs to be based on an insulating film having higher dielectric constant than conventional ones. By using a high dielectric constant insulating film, it is possible to increase the capacitance of the interelectrode insulating film without increasing the area of the interelectrode insulating film. Hence there is no need to use three-dimensional structures, and the manufacturing process can be simplified. Consequently, the performance of memory cells is enhanced, and the method for manufacturing semiconductor memory devices is simplified. Thus a manufacturing method with high yield can be realized.

However, because of the increased intercell interference associated with the downscaling of nonvolatile semiconductor memory devices, the degradation of memory characteristics cannot be prevented simply by using a high dielectric constant insulating film as the interelectrode insulating film. For example, a low dielectric constant insulating film can be used as the device isolation insulating film isolating between floating gate electrodes of memory cell transistors adjacent in the row direction (word line direction) of the memory cell array to reduce lateral opposing capacitance between the floating gate electrodes opposed to each other.

In a technique for reducing lateral opposing capacitance between floating gate electrodes adjacent in the column direction (bit line direction), the distance between floating gate electrodes is increased by oxidizing the side face of the floating gate electrodes of adjacent memory cells. Furthermore, in a proposed technique for preventing the decrease of interelectrode insulating film capacitance due to the sidewall oxidation of floating gate electrodes and increasing the coupling ratio, a laminated film made of a high dielectric constant insulating film sandwiched by oxidizer barrier films is used as the interelectrode insulating film (see, e.g., JP 2005-197363A). When the floating gate electrode sidewall is oxidized, penetration of oxidizer through the high dielectric constant oxide film can be prevented by the oxidizer barrier film such as silicon nitride ($Si_3N_4$) film. Hence oxidation of the floating gate electrode and the control gate electrode in the vicinity of the interface with the interelectrode insulating film is prevented. The "coupling ratio" used herein refers to the ratio of interelectrode insulating film capacitance to the sum of tunnel insulating film capacitance and interelectrode insulating film capacitance.

However, because the oxidizer barrier films sandwiching the high dielectric constant insulating film decreases the interelectrode insulating film capacitance, the coupling ratio cannot be sufficiently increased in substance. Thus, unfortunately, it is difficult to achieve reduction in feature size and increase in packing density for nonvolatile semiconductor memory devices without decreasing the interelectrode insulating film capacitance while preventing intercell interference.

SUMMARY OF THE INVENTION

According to an aspect of the invention, there is provided a semiconductor memory device including a plurality of memory transistors each having: a floating gate electrode including, in a cross section taken along a bit line direction, a first conductive film, first sidewall insulating films opposed to each other across the first conductive film, and a second conductive film provided on the first sidewall insulating films and the first conductive film; an interelectrode insulating film provided on the second conductive film; and a control gate electrode including a third conductive film provided on the interelectrode insulating film and a fourth conductive film provided on the third conductive film.

According to another aspect of the invention, there is provided a semiconductor memory device including a plurality of memory transistors each having: a semiconductor substrate including a source region and a drain region provided on the surface of the semiconductor substrates being apart from each other; a gate insulating film provided on the semiconductor substrate between the source region and the drain region; a floating gate electrode including, a first conductive film and a second conductive film provided on the first conductive film having a width of the second conductive film larger than a width of the first conductive film; an interelectrode insulating film provided on the second conductive film; and a control gate electrode including a third conductive film provided on the interelectrode insulating film and a fourth conductive film provided on the third conductive film.

According to another aspect of the invention, there is provided a method for manufacturing a semiconductor memory device, including: forming a gate structure in which a gate insulating film, a first conductive film, a second conductive film, an interelectrode insulating film, a third conductive film, and a fourth conductive film are successively laminated on a semiconductor substrate; and oxidizing at least a sidewall of the first conductive film with retaining conductivity of the second and third conductive films.

BRIEF DESCRIPTION OF THE DRAWINGS

FIGS. 5 to 11 and 13 are taken along the B-B direction of FIG. 2, FIG. 12 is taken along the C-C direction of FIG. 11, FIG. 14 is taken along the D-D direction of FIG. 13, and FIG. 15 is taken along the A-A direction of FIG. 2.

DETAILED DESCRIPTION OF THE INVENTION

Figure 1:
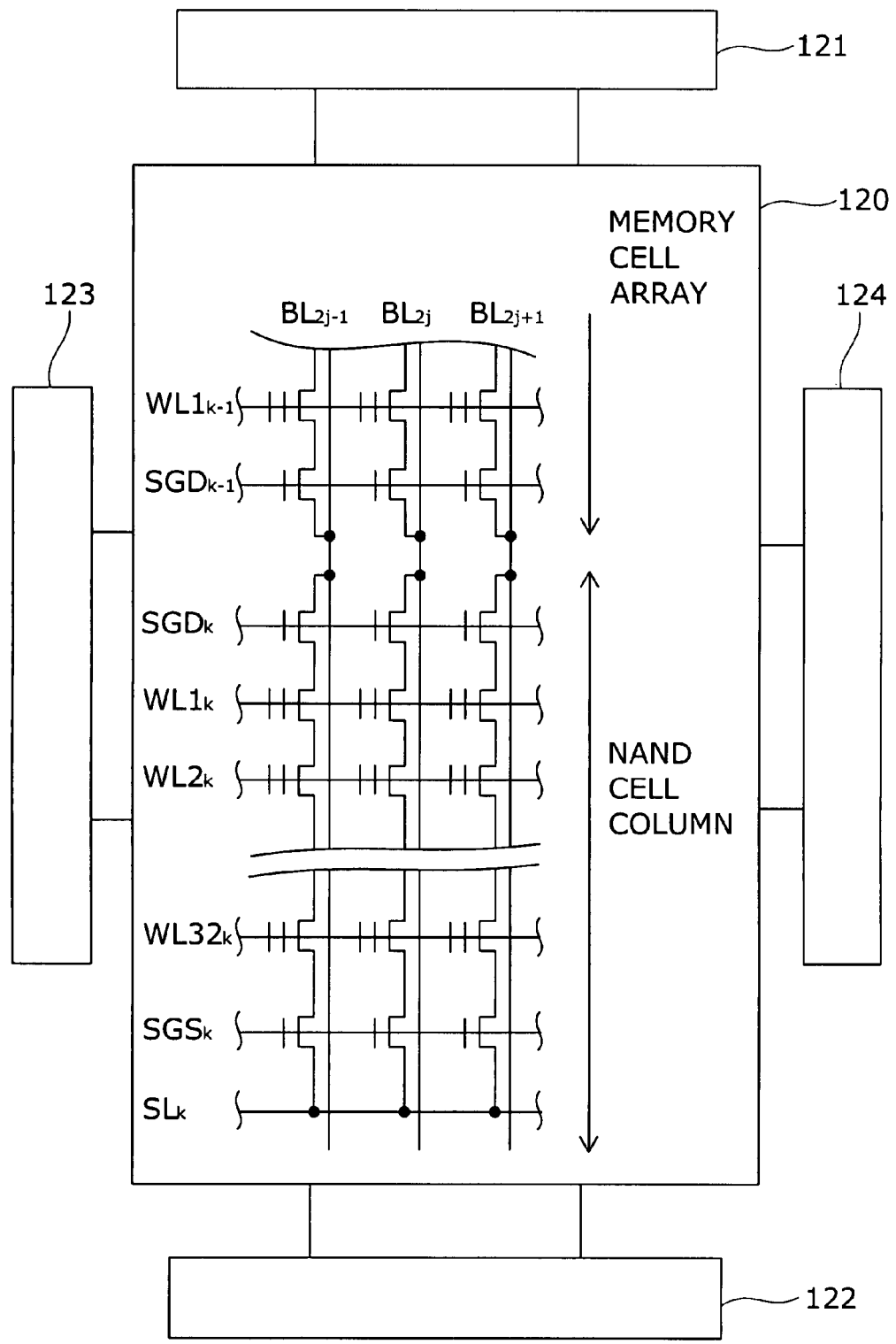
FIG. 1 is a schematic circuit configuration diagram showing a semiconductor memory device according to an embodiment of the invention.

An embodiment of the invention will now be described with reference to the drawings. In the following description of the drawings, like or similar elements are marked with like or similar reference numerals. However, the drawings are schematic. It should be noted that the relation of thickness to planar dimension and the ratio of thickness between various layers may be different from reality. Therefore the specific thickness or dimension should be determined by taking the following description into consideration. It is also understood that the dimensional relationship and/or ratio may be varied between some of the drawings. Furthermore, the following embodiment illustrates apparatuses and methods for embodying the technical spirit of the invention, which does not limit the material, shape, structure, and layout of components to those described in the following. Various modifications can be made within the spirit of the invention as defined by the claims.

As shown in FIG. 1, the semiconductor memory device according to the embodiment of the invention is a NAND electrically rewritable nonvolatile semiconductor memory device (EEPROM). A memory cell array 120 is surrounded by peripheral circuits (121, 122, 123, 124) such as a top page buffer 121, a bottom page buffer 122, a left row decoder/charge pump 123, and a right row decoder/charge pump 124.

Figure 2:
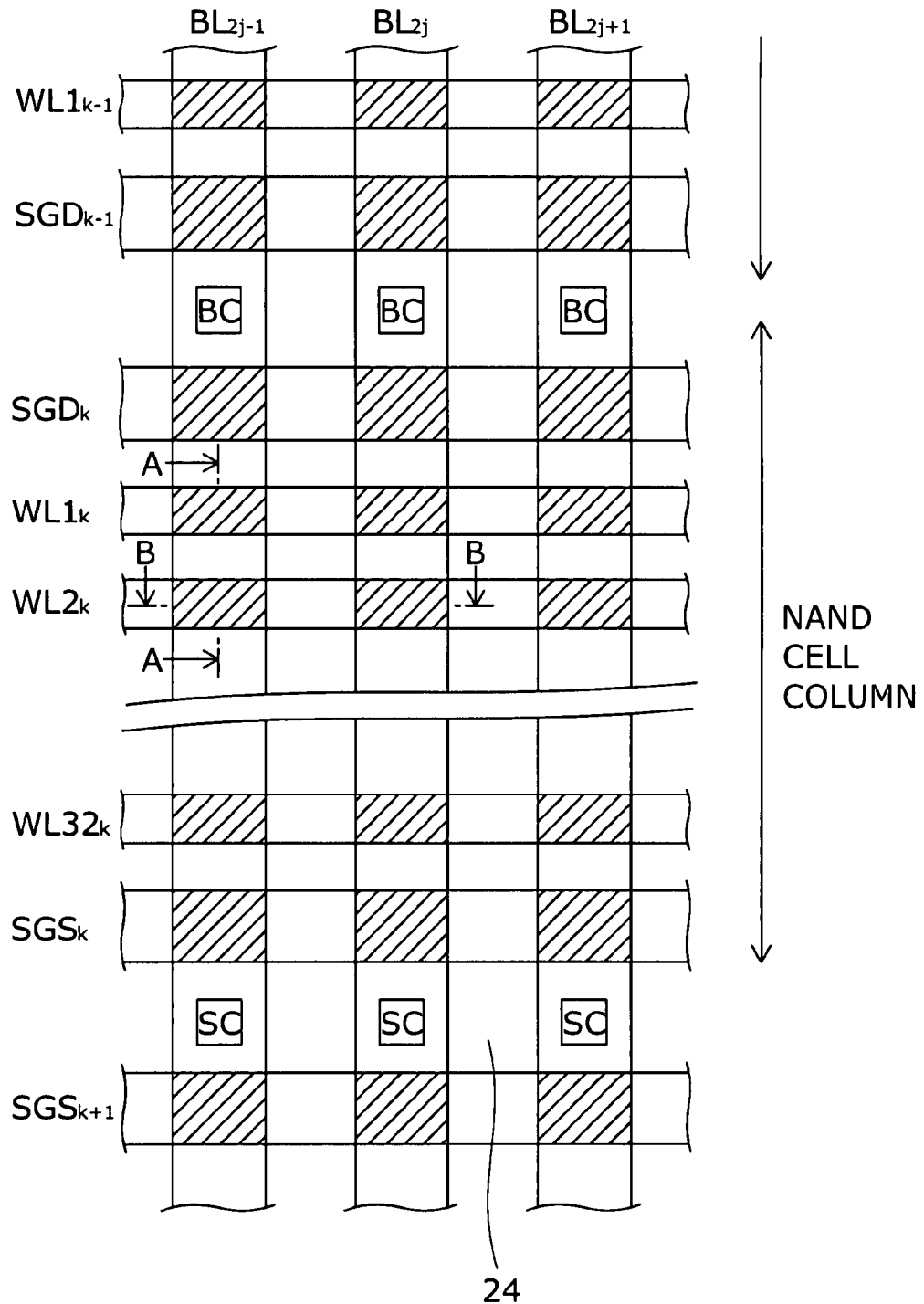
FIG. 2 is a schematic plan view showing part of a memory cell array of the semiconductor memory device according to the embodiment of the invention.

As shown in FIG. 2, the memory cell array 120 comprises a plurality of word lines $WL1_k$, $WL2_k$, ..., $WL32_k$, $WL1_{k-1}$, ... arranged in the row direction and a plurality of bit lines $BL_{2j-1}$, $BL_{2j}$, $BL_{2j+1}$, ... arranged in the column direction orthogonal to the word lines $WL1_k$, $WL2_k$, ..., $WL32_k$, $WL1_{k-1}$, .... In the column direction of FIG. 2, memory cell transistors each having a charge storage layer are arranged, where the charge storage state of the charge storage layer is controlled by one of the plurality of word lines $WL1_k$, $WL2_k$, ..., $WL32_k$, $WL1_{k-1}$, .... FIGS. 1 and 2 show a configuration where 32 memory cell transistors are arranged in the column direction to form a memory (NAND) cell column.

At both ends of the arrangement of a NAND cell column, a pair of select transistors for selecting a set of memory cell transistors arranged in the NAND cell column is placed adjacently in the column direction. A pair of select gate interconnects $SGD_k$, $SGS_k$ are connected to the gates of the pair of select transistors, respectively. A source interconnect $SL_k$ is connected to one of the source/drain regions of the select transistor. A plurality of bit line contacts BC and source contacts SC are connected to the source/drain regions of the select transistors.

The top page buffer 121 and the bottom page buffer 122 are connected to the bit lines $BL_{2j-1}$, $BL_{2j}$, $BL_{2j+1}$, ... and each serve as a buffer in reading the associated memory cell column information. The left row decoder/charge pump 123 and the right row decoder/charge pump 124 are connected to the word lines $WL1_k$, $WL2_k$, ..., $WL32_k$, $WL1_{k-1}$, ... to control the charge storage state of each memory cell transistor constituting the memory cell column.

Figure 3:
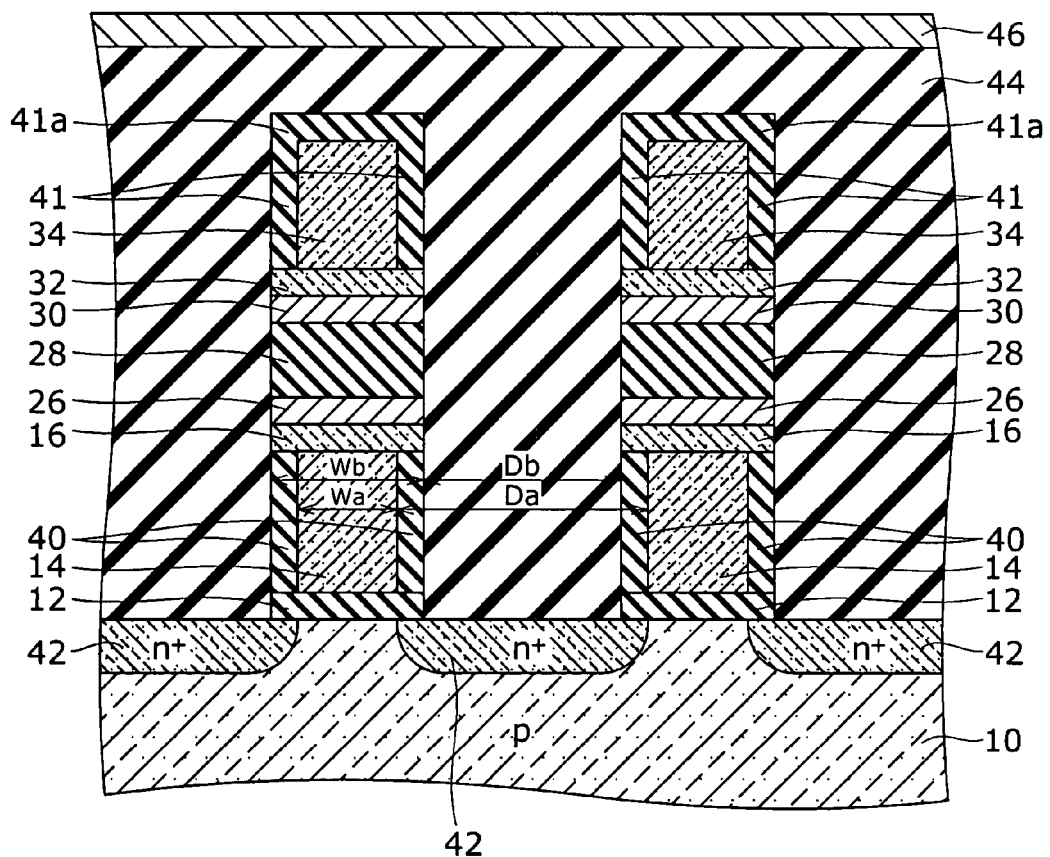
FIG. 3 is a cross-sectional view taken along the direction of line A-A in FIG. 2.
Figure 4:
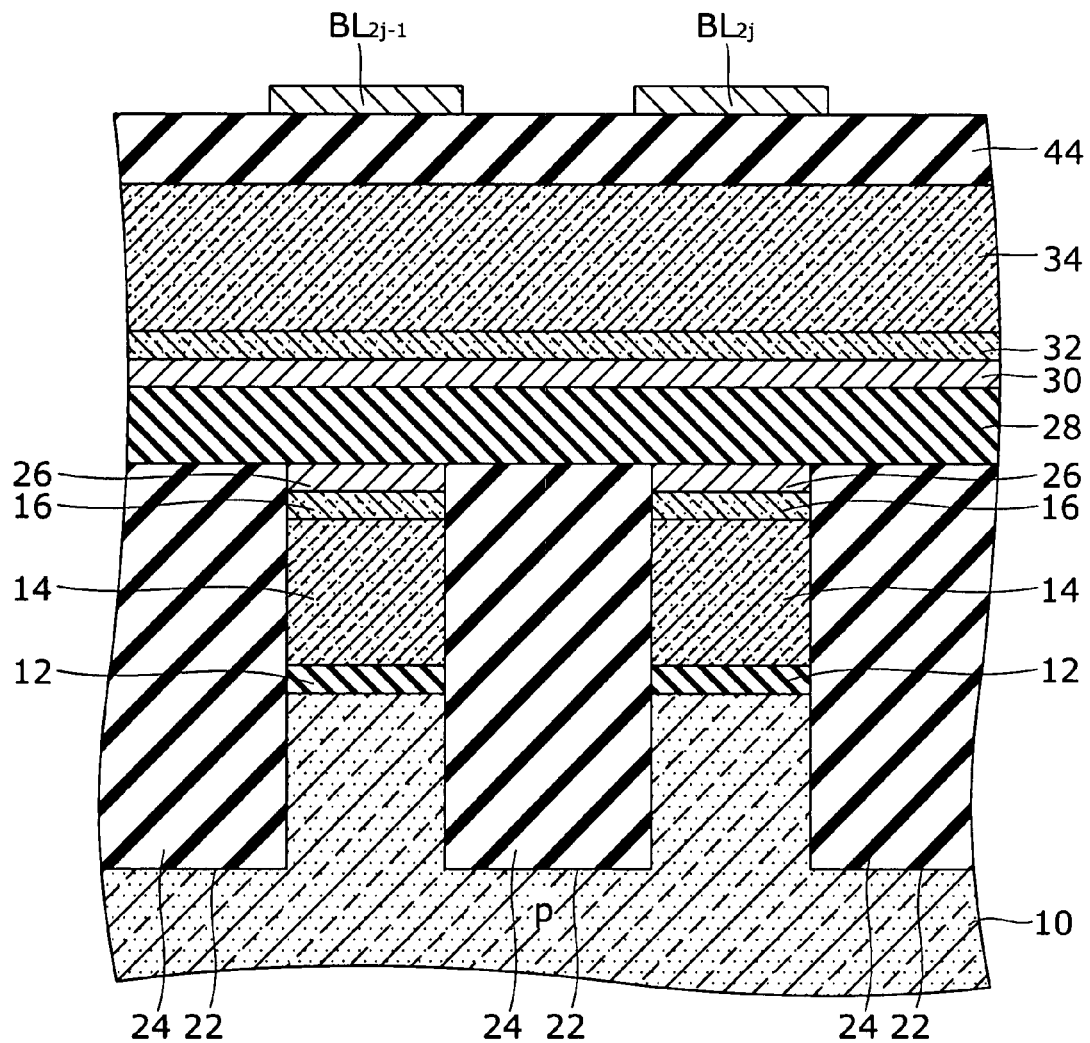
FIG. 4 is a cross-sectional view taken along the direction of line B-B in FIG. 2.

FIG. 3 is a schematic cross-sectional view showing part of the memory cell array 120 as viewed along the A-A direction (column direction) of FIG. 2, and FIG. 4 is a schematic cross-sectional view showing part of the memory cell array 120 as viewed along the B-B direction (row direction) of FIG. 2. That is, FIG. 3 corresponds to a cross section taken along the direction of the bit lines $BL_{2j-1}$, $BL_{2j}$, $BL_{2j+1}$, ... in FIG. 1, and FIG. 4 corresponds to a cross section taken along the direction of the word lines $WL1_k$, $WL2_k$, ..., $WL32_k$, $WL1_{k-1}$, ... in FIG. 1. As shown in FIGS. 3 and 4, a source/drain region 42 of the memory cell transistor is formed in the surface of a p-type semiconductor substrate 10, and a gate insulating film (tunnel oxide film) 12 is located on a channel region defined between each pair of source/drain regions 42. The source/drain region 42 is an $n^+$-type semiconductor region formed by doping the p-type semiconductor substrate 10 with n-type impurities at high concentration. Although not shown in FIG. 3, but clearly from FIGS. 1 and 2, a select transistor having nearly the same structure as the memory cell transistor is located at the end of the NAND cell column, and the source/drain region of the select transistor serves as a bit line contact region or a source contact region. The p-type semiconductor substrate 10 may be replaced by a p-type well region (p-well) formed in an n-type semiconductor substrate.

A floating gate electrode (14, 16, 26, 40) for storing charge, an interelectrode insulating film 28 on the floating gate electrode (14, 16, 26, 40), and a control gate electrode (30, 32, 34, 41, 41a) on the interelectrode insulating film 28 are located on the gate insulating film (tunnel oxide film) 12 to constitute a gate electrode of each memory cell transistor. Although not shown, the select transistor also has a gate electrode structure comprising a gate insulating film (tunnel oxide film) 12, a floating gate electrode (14, 16, 26, 40), an interelectrode insulating film 28, and a control gate electrode (30, 32, 34, 41, 41a). In the select transistor, the control gate electrode (30, 32, 34, 41, 41a) is electrically continuous with the floating gate electrode (14, 16, 26, 40) through an opening provided in the interelectrode insulating film 28. As shown in FIGS. 2 and 4, the floating gate electrodes (14, 16, 26, 40) of the memory cell transistors belonging to adjacent memory cell columns are opposed to each other in the row direction (word line direction) across a device isolation insulating film 24 embedded in a device isolation trench 22.

The floating gate electrode (14, 16, 26, 40) serving as a charge storage layer comprises a first conductive film 14, a first sidewall oxide film 40, a first antioxidation film 16, and a second conductive film 26. The first conductive film 14 is provided on the gate insulating film 12. In the cross section taken along the column direction (bit line direction) in which the source/drain regions 42 are opposed to each other, the first sidewall insulating films 40 made of materials including $SiO_2$ are opposed to each other across the first conductive film 14. The first antioxidation film 16 is provided on the first sidewall insulating film 40 and the first conductive film 14. The second conductive film 26 is provided on the first antioxidation film 16 and under the interelectrode insulating film 28.

The control gate electrode (30, 32, 34, 41, 41a) comprises a third conductive film 30, a second antioxidation film 32, a fourth conductive film 34, a second sidewall insulating film 41, and a cap insulating film 41a. The third conductive film 30 is provided on the interelectrode insulating film 28. The second antioxidation film 32 is provided on the third conductive film 30. The fourth conductive film 34 is provided on the second antioxidation film 32. In the cross section taken along the column direction (bit line direction), the second sidewall insulating films 41 made of materials including $SiO_2$ are opposed to each other across the fourth conductive film 34 on the second antioxidation film 32. The cap insulating film 41a of $SiO_2$ or $Si_3N_4$ is provided on the second sidewall insulating film 41 and the fourth conductive film 34. The third conductive film 30 is opposed to the second conductive film 26 across the interelectrode insulating film 28.

As shown in FIG. 3, in the cross section taken along the column direction (bit line direction), the dimension of a capacitor defined by the second and third conductive films 26, 30 and the interelectrode insulating film 28 is nearly equal to the cell length Wb of the memory cell. The dimension Wa of the first conductive film 14 in contact with the gate insulating film 12 corresponds to the gate length of the memory cell transistor and is smaller than the cell length Wb by the thickness of the first sidewall insulating film 40. Hence the dimension of the second and third conductive films 26, 30 defining the interelectrode insulating film capacitance is larger than the dimension of the first conductive film 14. The dimension of the fourth conductive film 34 is nearly equal to the dimension Wa of the first conductive film 14.

The width of the first conductive film 14 means the width of the first conductive film 14 in the direction along the channel length formed by the source/drain regions 42 and corresponds to Wa as shown in FIG. 3. The width of the second and the third conductive films 26, 30 means the width of the second and third conductive films in the direction along the channel length and corresponds to Wb as shown in FIG. 3. As mentioned above, in the semiconductor memory device according to the embodiment of the invention, the lateral opposing capacitance between the floating gate electrodes can be decreased without a change of the interelectrode insulating film capacitance defined by the second and third conductive films 26, 30 across the interelectrode insulating film 28.

As is evident from the cross-sectional view taken along the column direction shown in FIG. 3, in the semiconductor memory device according to the embodiment of the invention, the floating gate electrodes (14, 16, 26, 40) of the memory cell transistors are opposed to each other across an interlayer insulating film 44. Here, by embedding a low dielectric constant insulating film having a relative dielectric constant $\in_r$ lower than that of thermal oxide $SiO_2$ film, 3.9, as the interlayer insulating film 44 between each pair of floating gate electrodes (14, 16, 26, 40) of the plurality of memory cell transistors arranged in the column direction, it is possible to prevent write errors due to intercell interference in the column direction from occurring between memory cell transistors adjacent to each other in the column direction in the same column.

Although not shown, a contact plug is embedded in the interlayer insulating film 44 and forms an ohmic contact with the bit line contact region with low contact resistance. The contact plug is connected to the bit line ($BL_{2j-1}$) 46 located on the interlayer insulating film 44. In FIG. 4, the bit lines $BL_{2j-1}$, $BL_{2j}$ are located on the interlayer insulating film 44. However, damascene interconnect may also be used, where a damascene trench is formed in the interlayer insulating film 44, and a metal interconnect primarily composed of copper (Cu) is embedded inside the damascene trench.

Although not shown, the peripheral transistor is configured as a transistor having nearly the same laminated structure as the select transistor, or as a transistor having a gate electrode corresponding to the structure only with the control gate electrode (30, 32, 34, 41, 41a) where the floating gate electrode (14, 16, 26, 40) and the interelectrode insulating film 28 are omitted from the laminated structure of the select transistor.

The second and third conductive films 26, 30 can be made of oxide conductors such as lanthanum nickel oxide ($LaNiO_3$), lanthanum titanium oxide ($LaTiO_3$), lanthanum cobalt oxide ($LaCoO_3$), strontium ruthenium oxide ($SrRuO_3$), ruthenium oxide ($RuO_2$), and iridium oxide ($IrO_2$). For example, $LaNiO_3$ film is a good conductor with a resistivity of about 20 $\mu\Omega cm$. The first and second antioxidation films 16, 32 can be silicon carbide (SiC) or other conductive films being less susceptible to reaction and inward diffusion of oxidizers such as oxygen and water. A conductive film of polycrystalline silicon doped with n-type impurities such as phosphorus (P) or arsenic (As) (hereinafter referred to as "doped poly-Si") can be used for the first conductive film 14. A doped poly-Si or other conductive film can be used for the fourth conductive film 34. The fourth conductive film 34 may have a two-layer structure of doped poly-Si film and tungsten silicide ($WSi_2$) film. Besides $WSi_2$ film, the silicide film may be any other metal silicide film such as cobalt silicide ($CoSi_2$) film, titanium silicide ($TiSi_2$) film, or molybdenum silicide ($MoSi_2$) film. Instead of silicide film, high-melting-point metal such as tungsten (W), cobalt (Co), titanium (Ti), or molybdenum (Mo), or polycide film based on these silicide films may be used. Instead of using silicide film, a highly conductive metal film of aluminum (Al) or copper (Cu) may be placed on the polycrystalline silicon film to also serve as the word lines $WL1_k$, $WL2_k$, ..., $WL32_k$, $WL1_{k-1}$, .... Alternatively, the silicide film may be replaced by a laminated film of one or more of tungsten nitride (WN) film and titanium nitride (TiN, $Ti_2N$) film on the doped poly-Si film.

Various insulating films can be used as the interelectrode insulating film 28. However, for functionality as a semiconductor memory device, the capacitance of the floating gate electrode (14, 16, 26, 40) and the control gate electrode (30, 32, 34, 41, 41a) across the interelectrode insulating film 28 needs to be more than a certain value. In particular, a semiconductor memory device with its minimum line width downscaled to about 30 nm or less has a small opposing area of the floating gate electrode (14, 16, 26, 40) and the control gate electrode (30, 32, 34, 41, 41a). In view of the coupling capacitance between the floating gate electrode (14, 16, 26, 40) and the control gate electrode (30, 32, 34, 41, 41a), it is preferable to use a high dielectric constant insulating material with relative dielectric constant $\in_r$ higher than that of $SiO_2$ film. For example, the interelectrode insulating film 28 is preferably a high dielectric constant insulating film of hafnium aluminate (HfAlO), zirconium aluminate (ZrAlO), or lanthanum aluminate (LaAlO).

Alternatively, the interelectrode insulating film 28 may be an ONO film having a relative dielectric constant of about 5 or more. Furthermore, it is also possible to use a monolayer film of any one of strontium oxide (SrO) film, silicon nitride ($Si_3N_4$) film, aluminum oxide ($Al_2O_3$) film, magnesium oxide (MgO) film, yttrium oxide ($Y_2O_3$) film, hafnium oxide ($HfO_2$) film, zirconium oxide ($ZrO_2$) film, tantalum oxide ($Ta_2O_5$) film, and bismuth oxide ($Bi_2O_3$) film, or a composite film in which a plurality thereof are laminated. Moreover, a composite film thereof with $SiO_2$ film may also be used. The composite film may have a laminated structure of three or more layers. That is, it is preferable that the insulating film include, at least in part, the above material having a relative dielectric constant $\in_r$ of 5 to 6 or more. However, in the case of composite film, it is preferable to select the combination so that the effective relative dielectric constant $\in_{reff}$ measured for the entire film is 5 to 6 or more. While the following description illustratively uses HfAlO film as the interelectrode insulating film 28, it will be clear from the foregoing description that the invention is not limited thereto.

The interlayer insulating film 44 can be a low dielectric constant insulating film of inorganic insulating material such as carbon (C) or fluorine (F) doped silicon monoxide (SiOC, SiOF), spin-on-glass (SOG) such as hydrogen silsesquioxane polymer (HSQ), alkylsilsesquioxane polymer (MSQ), hydrogen alkylsilsesquioxane polymer (HOSP), and organic silica, spin-on-dielectric (SOD) such as polyarylene ether (PAE) and benzocyclobutene (BCB), and materials obtained by porosifying these materials. The device isolation insulating film 24 can be a low dielectric constant insulating film of SOD organic polymer such as polysilazane (PSZ) in addition to the low dielectric constant insulating films of the above inorganic insulating materials, SOG, and SOD.

Typically, as a nonvolatile semiconductor memory device is downscaled, the cell area decreases, and the intercell distance decreases as well. The amount of signal charge stored on the floating gate electrode serving as a charge storage layer is proportional to the interelectrode insulating film capacitance of the capacitor defined by the floating gate electrode and the control gate electrode opposed across the interelectrode insulating film. As the cell area decreases, the interelectrode insulating film capacitance decreases. As the intercell distance decreases, the lateral opposing capacitance between adjacent floating gate electrodes increases. Hence intercell interference becomes pronounced, in which the threshold of the memory cell transistor is varied due to the electric potential variation of the floating gate electrodes of adjacent cells. For reducing the intercell interference, it is important to increase the amount of signal charge on the floating gate electrode or to decrease the lateral opposing capacitance between adjacent floating gate electrodes.

A solution to decreasing the lateral opposing capacitance between adjacent floating gate electrodes is to reduce the dimension of the floating gate electrode to decrease the cell area. However, simply decreasing the cell area involves decreasing the interelectrode insulating film capacitance. Furthermore, it is difficult to decrease the area of the floating gate electrode because the cell area is originally designed with minimum dimension.

On the other hand, conventionally, the side face of the floating gate electrode is oxidized for reducing the leak current of a memory cell. Oxidization of poly-Si in the floating gate electrode sidewall increases the distance between adjacent floating gate electrodes, and hence the lateral opposing capacitance between adjacent floating gate electrodes can be decreased. However, when the floating gate electrode is formed only from poly-Si, oxidation of the floating gate electrode sidewall unfortunately results in decreasing the effective cell area and decreasing the interelectrode insulating film capacitance.

In the nonvolatile semiconductor memory device according to the embodiment, oxide conductors are used for the second and third conductive films 26, 30 opposed across the interelectrode insulating film 28. Poly-Si sidewall oxidation of the first conductive film 14 of the floating gate electrode (14, 16, 26, 40) results in increasing the distance between adjacent first conductive films 14 from Db to Da as shown in FIG. 3. Furthermore, the dimension of the first conductive film 14, corresponding to the gate length of the memory cell transistor, decreases from Wb to Wa. On the other hand, the second and third conductive films 26, 30, being oxide conductors, remain conductive without being subjected to sidewall oxidation. Hence they do not undergo dimensional variation even after the sidewall oxidation process. Thus the lateral opposing capacitance between the floating gate electrodes (14, 16, 26, 40) can be decreased. The decrease in the dimension of the first conductive films 14 results in decreasing the gate insulating film capacitance. The interelectrode insulating film capacitance defined by the second and third conductive films 26, across the interelectrode insulating film 28 is left unchanged. Hence the coupling ratio can be increased with preventing the intercell interference, and a sufficient amount of signal charge can be ensured.

For example, when the memory cell has a cell length Wb of about 30 nm, the thickness of the first sidewall insulating film 40 is preferably set to about 1 nm to about 10 nm. Because poly-Si natural oxide film has a thickness of about 1 nm, the thickness of the first sidewall insulating film 40 is preferably set to about 1 nm or more. If the thickness of the first sidewall insulating film 40 is set to about 10 nm or more, the dimension Wa of the first conductive film 14 is decreased to about 10 nm or less. In this case, the gate length of the memory cell transistor is decreased to about 10 nm or less, and the performance of the memory cell transistor is degraded due to the short channel effect.

In the nonvolatile semiconductor memory device according to the embodiment, the interlayer insulating film 44 and the device isolation insulating film 24 are low dielectric constant insulating films. Hence lateral opposing capacitance between adjacent floating gate electrodes can be decreased.

In the nonvolatile semiconductor memory device according to the embodiment, the first and second antioxidation films 16, 32 are provided between the first and second conductive films 14, 26 and between the third and fourth conductive films 30, 34, respectively. Thus it is possible to prevent oxidizer from diffusing from the oxide conductors of the second and third conductive films 26, 30 during the poly-Si sidewall oxidation. Hence oxidation of poly-Si in the first and fourth conductive films 14, 34 can be prevented in the vicinity of the interface with the first and second antioxidation film 16, 32.

Next, a method for manufacturing a semiconductor memory device according to the embodiment of the invention is described with reference to FIGS. 5 to 15. The method for manufacturing a semiconductor memory device described below is merely an example. It is understood that various other manufacturing methods, including this example, can be realized.

Figure 5:
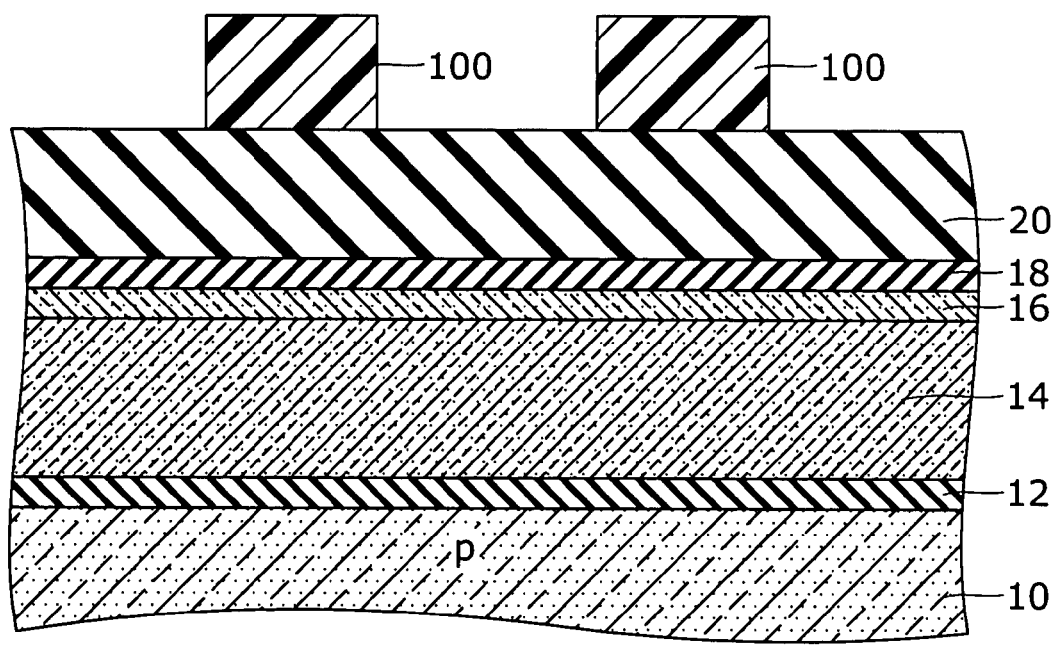
FIGS. 5 to 15 are process cross-sectional views for illustrating an example method for manufacturing a semiconductor memory device according to the embodiment of the invention, where

(a) First, as shown in FIG. 5, on a p-type semiconductor substrate 10 (or p-type well formed in an n-type silicon substrate) such as an Si substrate, a gate insulating film (tunnel insulating film) 12 is formed by thermal oxidation to a thickness of about 1 to about 15 nm. On the gate insulating film 12, a first conductive film 14 of doped poly-Si is deposited by chemical vapor deposition (CVD) to a thickness of about 10 to about 200 nm. A first antioxidation film 16 of SiC is deposited by CVD to a thickness of about 10 nm. Subsequently, an $Si_3N_4$ film 18 having a thickness of about 50 to about 200 nm and an $SiO_2$ film 20 having a thickness of about 50 to about 400 nm are deposited. Then photoresist is processed by photolithography into a desired pattern to form a resist mask 100.

Figure 6:
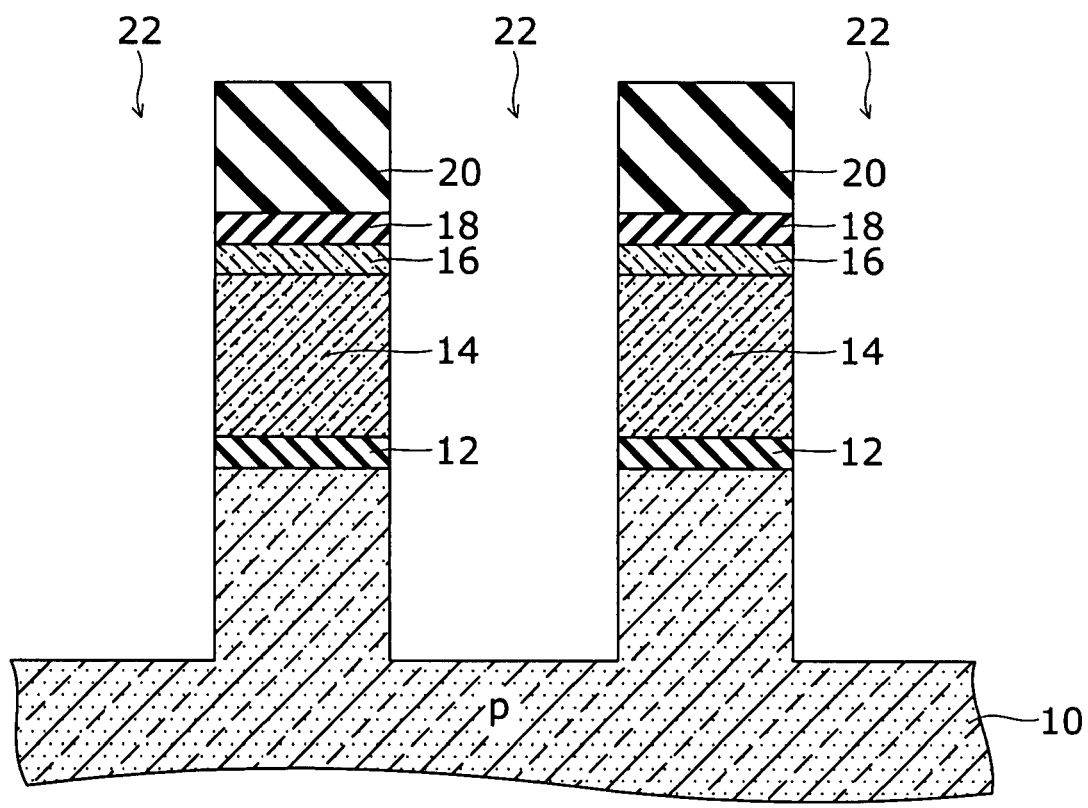

(b) As shown in FIG. 6, the resist mask 100 is used as a mask to selectively remove the $SiO_2$ film 20 by reactive ion etching (RIE). After removing the resist mask 100 with resist peeling liquid, the patterned $SiO_2$ film 20 is used as a mask to selectively remove the $Si_3N_4$ film 18 by RIE. Subsequently, the first antioxidation film 16, the first conductive film 14, the gate insulating film 12, and the semiconductor substrate 10 are selectively removed by RIE to form device isolation trenches 22 in the semiconductor substrate 10. A high-temperature post-oxidation process is performed to eliminate damage on the surface of the first conductive film 14, the gate insulating film 12, and the silicon semiconductor substrate 10 exposed by RIE.

Figure 7:
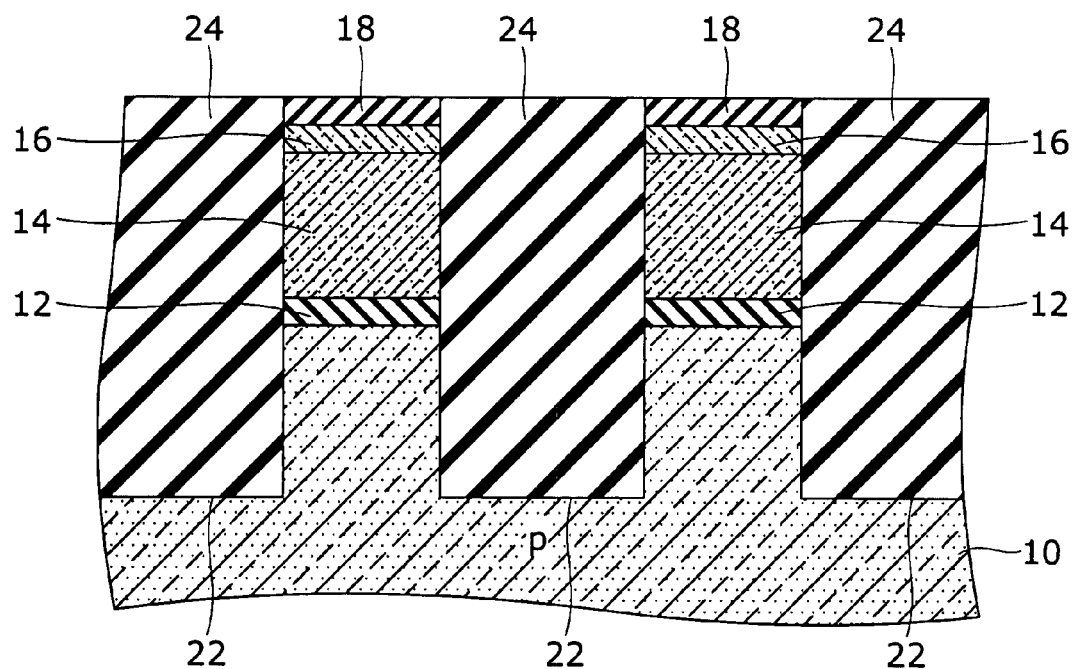

(c) As shown in FIG. 7, an SOD such as PSZ film is applied to a thickness of about 200 to about 1500 nm to fill the device isolation trench 22 with a device isolation insulating film 24. The device isolation insulating film 24 is densified by high-temperature heat treatment under a nitrogen or oxygen atmosphere. The $Si_3N_4$ film 18 is used as a stopper to planarize the device isolation insulating film 24 by chemical mechanical polishing (CMP). The device isolation insulating film 24 and the $SiO_2$ film 20 on the $Si_3N_4$ film 18 are removed. The $Si_3N_4$ film 18 is removed with hot phosphoric acid ($H_3PO_4$), which can etch $Si_3N_4$ with a certain selection ration relative to $SiO_2$.

Figure 8:
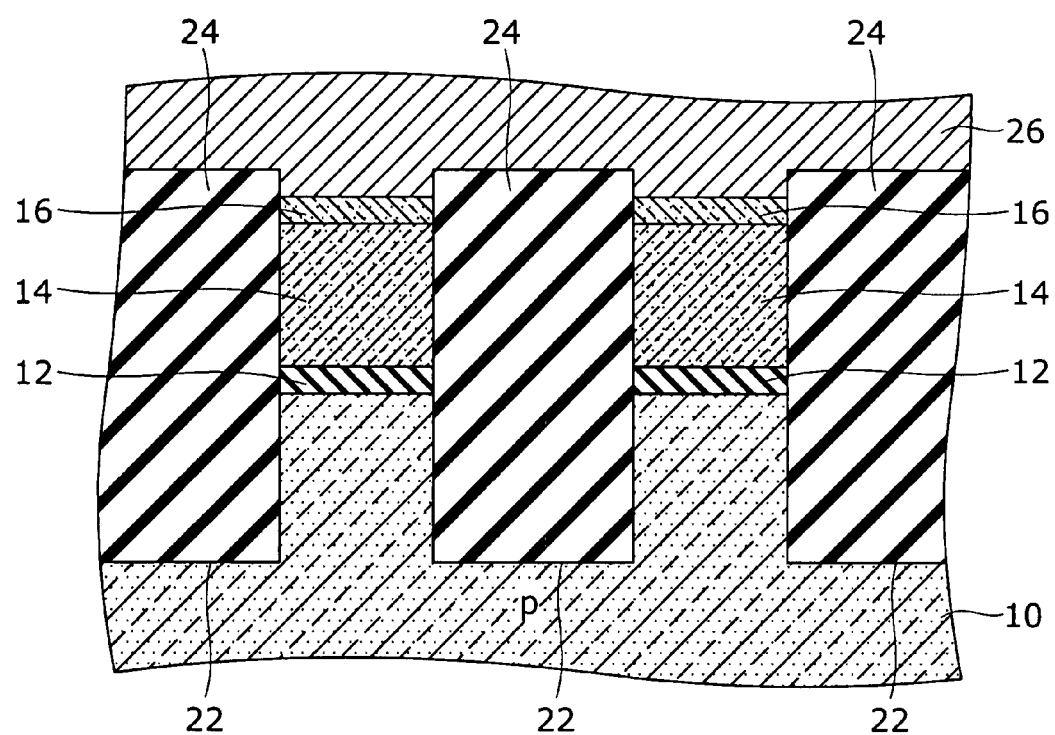

(d) As shown in FIG. 8, a second conductive film 26 is deposited by sputtering with good step coverage so as to fill in the trench from which the $Si_3N_4$ film 18 has been removed. The second conductive film 26 is a $LaNiO_3$ or other oxide conductive film. Then the device isolation insulating film 24 is used as a stopper to planarize the second conductive film 26 to a thickness of about 10 nm by CMP. The second conductive film 26 deposited on the device isolation insulating film 24 is removed.

Figure 9:
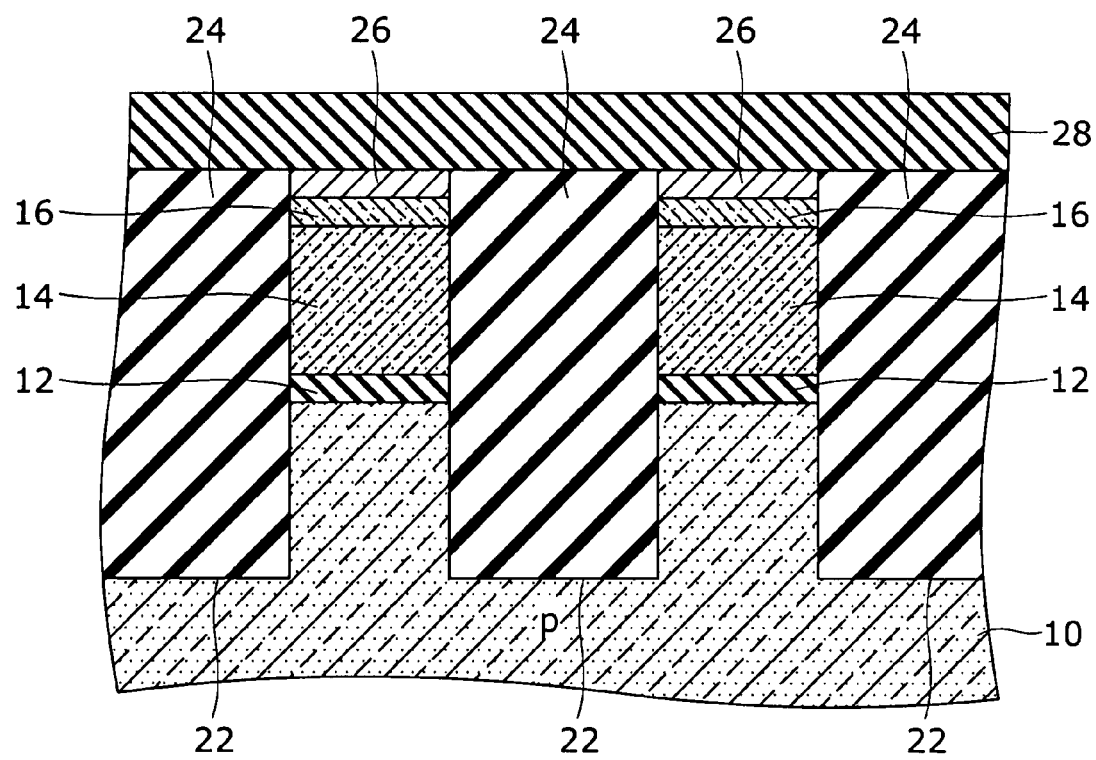

(e) As shown in FIG. 9, an interelectrode insulating film 28 having higher dielectric constant than $SiO_2$ is deposited on the planarized second conductive film 26 and the device isolation insulating film 24. Here, preferably, the interelectrode insulating film 28 has a relative dielectric constant higher than that of $SiO_2$ film, about 3.8 to about 4, particularly higher than that of ONO film, about 5 to about 5.5. In the embodiment, the interelectrode insulating film 28 is made of HfAlO. By way of example, a method for depositing an HfAlO film by atomic layer deposition (ALD) is described below in detail.

The semiconductor substrate 10 is transported into a vacuum chamber with the pressure maintained at about 40 Pa, and is heated to a substrate temperature of 290° C. Trimethylaluminum (TMA) serving as an aluminum (Al) raw material gas and ozone ($O_3$) serving as an oxidizer are alternately supplied to the semiconductor substrate 10 to deposit an aluminum oxide (AlO) film composed of Al atomic layers and O atomic layers. Furthermore, tetrakis ethylmethylamino hafnium (TEMAH) serving as a hafnium (Hf) raw material gas and $O_3$ are alternately supplied to the semiconductor substrate 10 to deposit a hafnium oxide (HfO) film composed of Hf atomic layers and O atomic layers. The AlO film and the HfO film are repeated a desired number of layers, respectively, thereby depositing an HfAlO film having a required thickness and composition ratio between Al and Hf.

For example, the carrier gas of TMA and TEMAH has a flow rate of about 200 sccm and about 500 sccm, respectively, and the flow rate of $O_3$ is about 5 slm. The concentration of $O_3$ is about 250 g/m³. The supply time of raw material gas is about 1 second for TMA, about 2 seconds for TEMAH, and about 3 seconds for $O_3$. For purging the atmosphere in the vacuum chamber, nitrogen ($N_2$) gas is passed at about 5 slm for about 2 to about 3 seconds between the alternate supply of TMA and $O_3$ and between the alternate supply of TEMAH and $O_3$.

Specifically, with regard to the number of times of alternate supply, a sequence of 13 iterations of alternate supply of TEMAH and $O_3$ followed by one alternate supply of TMA and $O_3$ is repeated 15 times. Thus an HfAlO film having a thickness of about 25 nm is deposited. Here, it is possible to vary the composition ratio between Al and Hf by varying the number of times, 13, of alternate supply of TEMAH and $O_3$. Furthermore, it is possible to vary the thickness of the HfAlO film by varying the number of repetitions, 15, of the sequence.

Here, the ratio of the number of times of alternate supply of TEMAH and $O_3$ to the number of times of alternate supply of TMA and $O_3$ is 13:1. More generally, the ratio of the number of times of alternate supply is within the range from 4:1 to 100:1, and preferably within the range from 9:1 to 19:1. The HfAlO film is a high dielectric constant insulating film having a relative dielectric constant of about 10 to about 25, and the relative dielectric constant increases with the increase of Hf concentration in the film. However, as compared to the Al atom, the Hf atom has a weaker binding force with the O atom, and oxygen defects are more likely to occur as the Hf concentration in the HfAlO film increases. Oxygen defects are responsible for increasing leak current in the HfAlO film. If the ratio of the number of times of Al alternate supply is less than 4:1, the relative dielectric constant of the HfAlO film unfortunately decreases. If the ratio of the number of times of Al alternate supply exceeds 100:1, leak current in the HfAlO film ends up increasing due to the increased Hf concentration in the HfAlO film.

The deposition is followed by post-deposition annealing (PDA) at a temperature of about 500 to about 1200° C., illustratively by furnace annealing for about 10 minutes to about 2 hours or by lamp annealing for about 1 second to about 30 minutes. By this PDA process, the HfAlO film is densified, and its film quality is improved.

Figure 10:
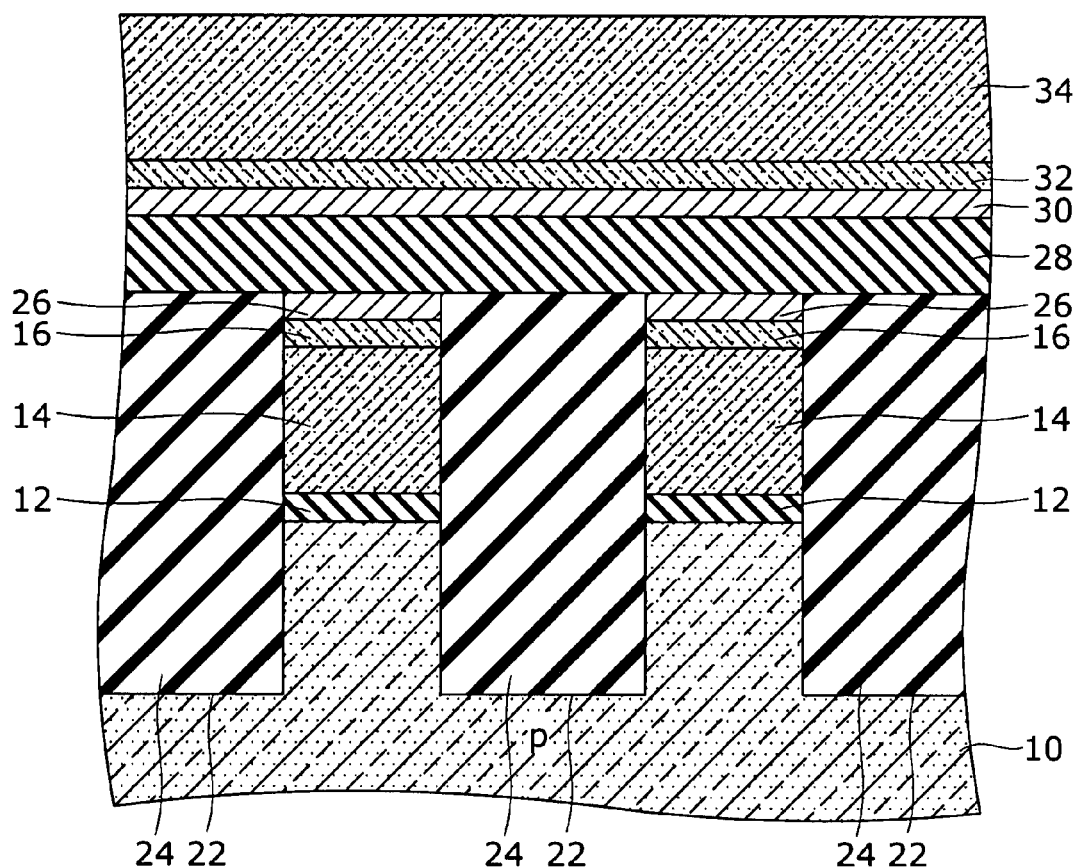

(f) As shown in FIG. 10, on the interelectrode insulating film 28, a third conductive film 30, a second antioxidation film 32, and a fourth conductive film 34 are successively deposited by sputtering and CVD. The third conductive film 30 is a $LaNiO_3$ or other oxide conductive film having a thickness of about 10 nm. The second antioxidation film 32 is made of SiC with a thickness of about 10 nm. The fourth conductive film 34 is made of doped poly-Si with a thickness of about 10 nm to about 200 nm.

Figure 11:
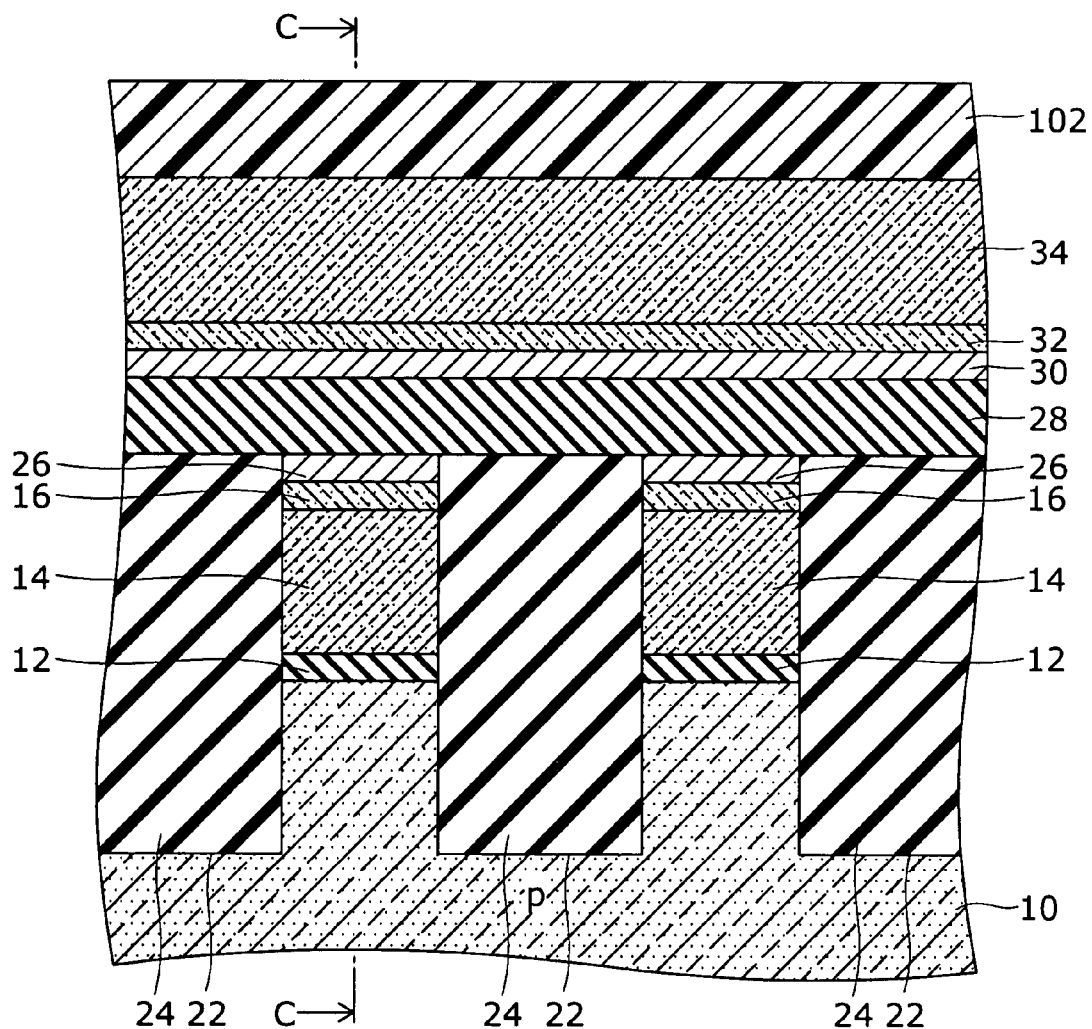
Figure 12:
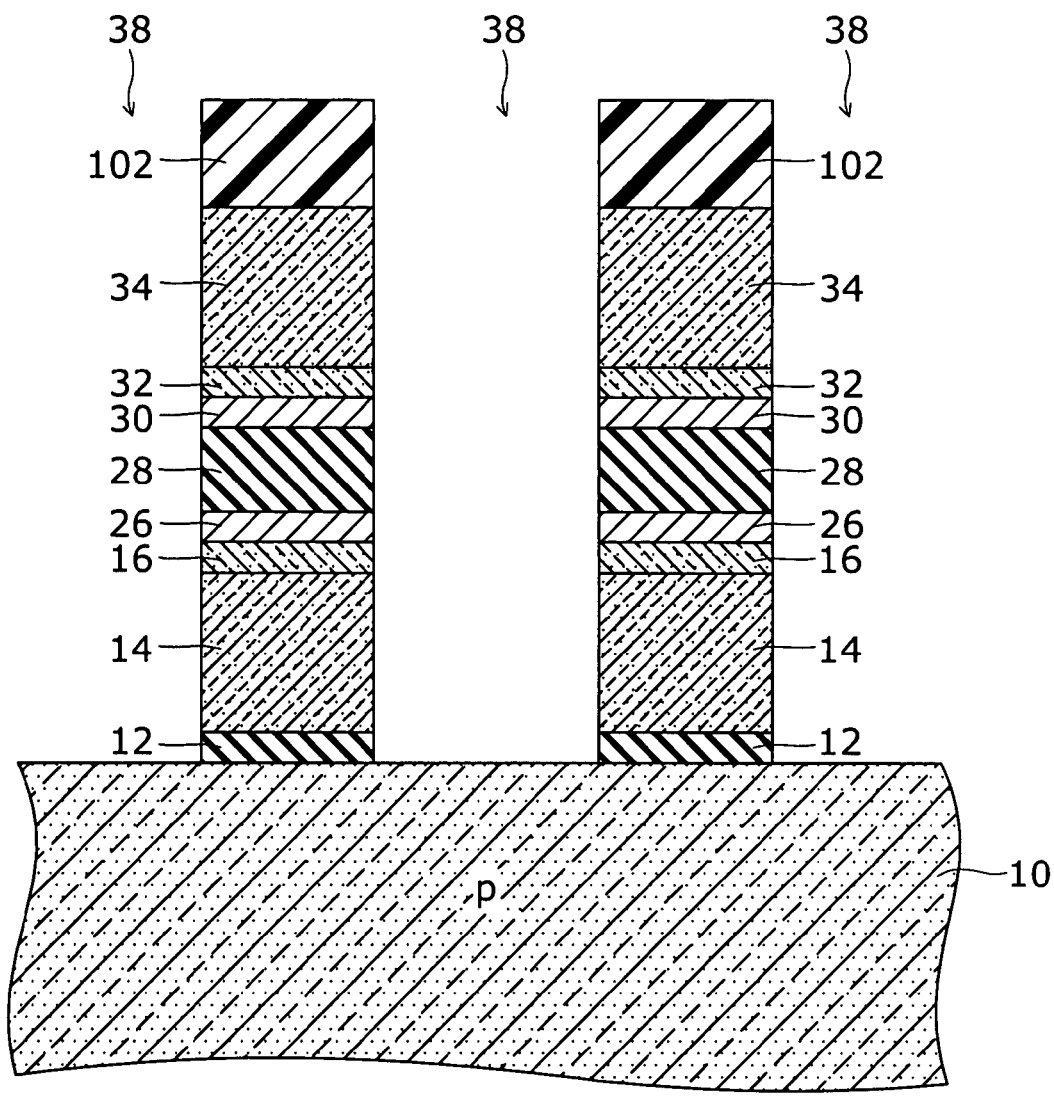

(g) As shown in FIGS. 11 and 12, photoresist applied onto the fourth conductive film 34 is processed by photolithography into a desired pattern to form a resist mask 102. The resist mask 102 is used as a mask to selectively remove, by RIE, the fourth conductive film 34, the second antioxidation film 32, the third conductive film 30, the interelectrode insulating film 28, the second conductive film 26, the first antioxidation film 16, the first conductive film 14, and the gate insulating film 12. Thus, as shown in FIG. 12, the gate structures of memory cell transistors are formed, which are isolated by a plurality of slit-like cell isolation trenches 38 extending in the row direction (word line direction).

Figure 13:
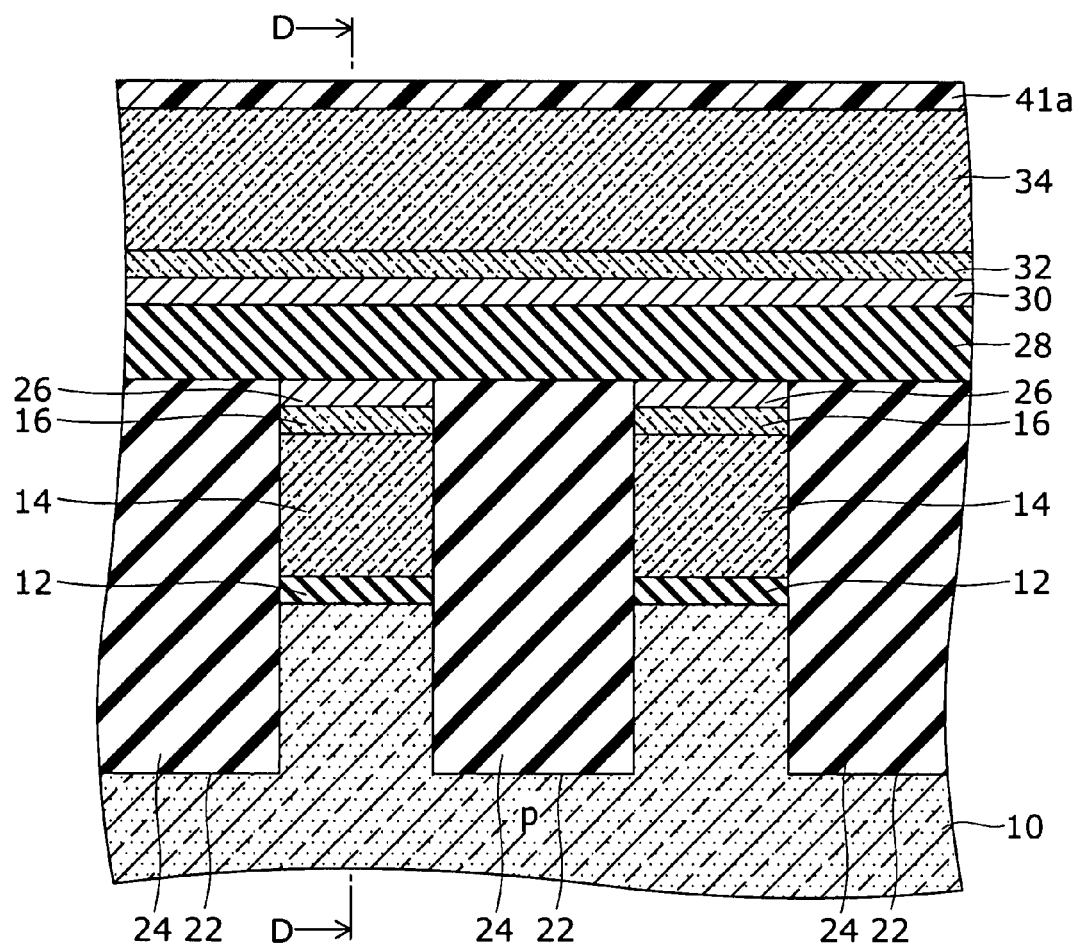
Figure 14:
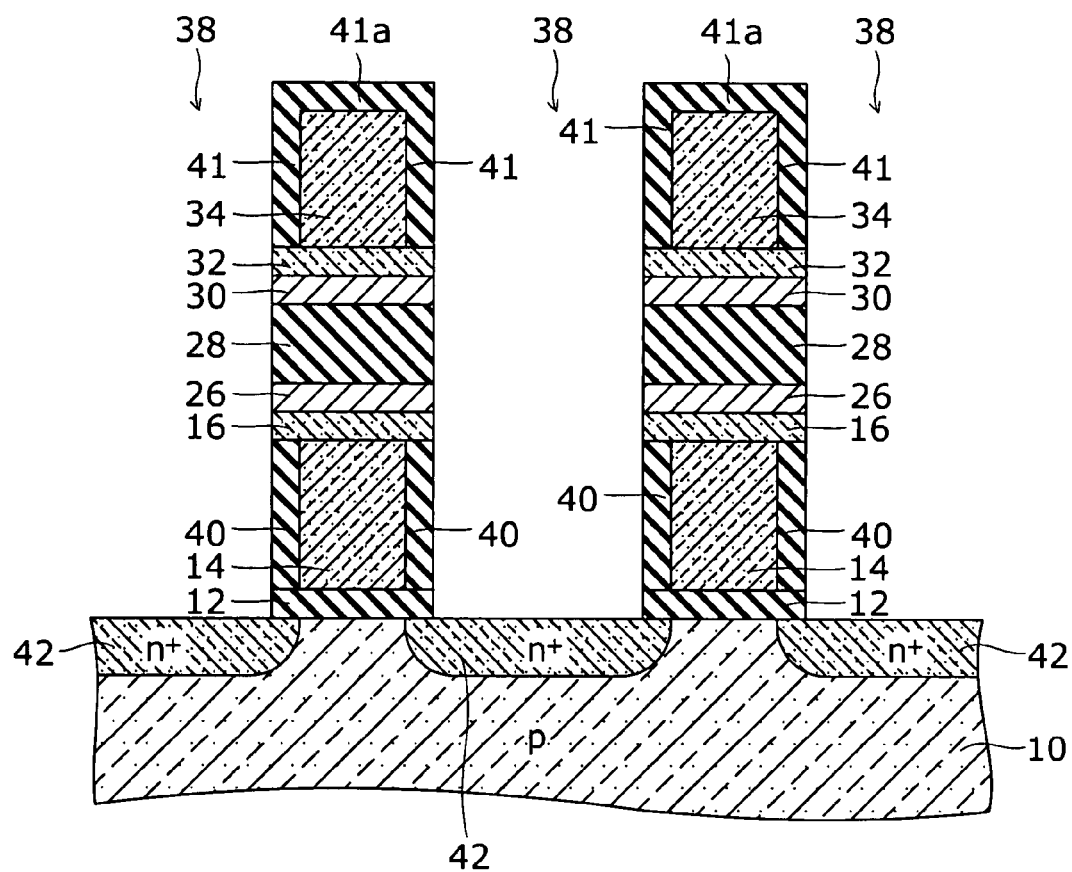

(h) As shown in FIGS. 13 and 14, the first and fourth conductive film 14, 34 of each gate structure are thermally oxidized to form a first sidewall insulating film 40, a second sidewall insulating film 41, and a cap insulating film 41a. Consequently, in the cross section taken along the column direction (bit line direction), a control gate electrode (30, 32, 34, 41, 41a) is formed, which is composed of the third conductive film 30, the second antioxidation film 32, the fourth conductive film 34, the second sidewall insulating film 41, and the cap insulating film 41a of each memory cell transistor isolated from another by the cell isolation trench 38 in the cell column. Similarly, a floating gate electrode (14, 16, 26, 40) is formed, which is composed of the first conductive film 14, the first antioxidation film 16, the second conductive film 26, and the first sidewall insulating film 40 of each memory cell transistor. The gate structures isolated from each other by the cell isolation trenches 38 are used as a mask to implant, in a self-aligned manner, n-type impurity ions such as arsenic (As) or phosphorus (P) ions into the semiconductor substrate 10 exposed to the cell isolation trenches 38. By activation annealing subsequent to the ion implantation, $n^+$-type source/drain regions 42 are formed in the surface of the semiconductor substrate 10.

Figure 15:
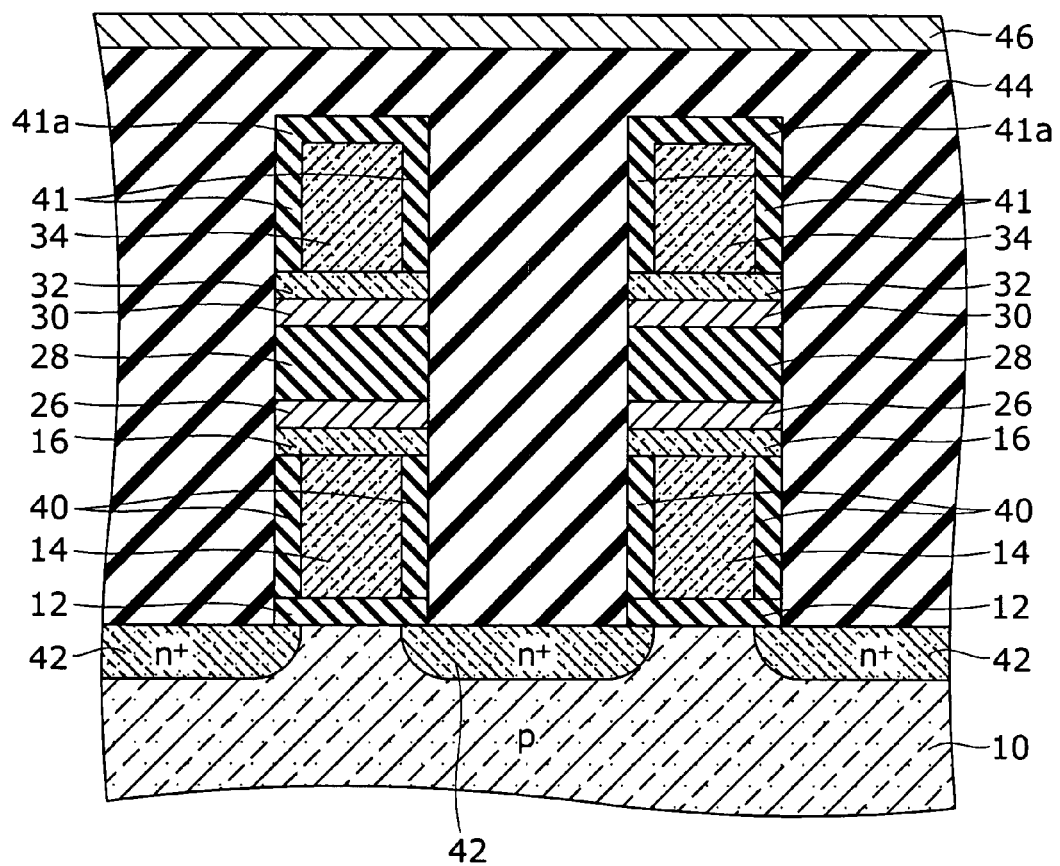

(i) As shown in FIG. 15, an interlayer insulating film 44 is formed by applying an SOG or other low dielectric constant insulating film so as to fill in the cell isolation trench 38. Next, after applying photoresist on the entire surface, the photoresist is patterned by photolithography to form a resist mask. This resist mask is used as a mask to open a contact hole (not shown) in the interlayer insulating film 44 by RIE. The contact hole is filled with a contact plug (not shown) of tungsten by sputtering. Furthermore, bit lines 46 are patterned on the interlayer insulating film 44 by sputtering, photolithography, and etching. Thus the semiconductor memory device according to the embodiment shown in FIGS. 3 and 4 is completed.

In the method for manufacturing a semiconductor memory device according to the embodiment, oxide conductors are used for the second and third conductive films 26, 30 opposed across the interelectrode insulating film 28. The second and third conductive films 26, 30 remains conductive even after the sidewall oxidation of the first and fourth conductive films 14, 34. Hence the lateral opposing capacitance between the floating gate electrodes (14, 16, 26, 40) can be decreased, and gate insulating film capacitance can be decreased. Furthermore, the interelectrode insulating film capacitance defined by the second and third conductive films 26, across the interelectrode insulating film 28 is left unchanged. Hence the coupling ratio can be increased with preventing the intercell interference, and a sufficient amount of signal charge can be ensured.

In the method for manufacturing a semiconductor memory device according to the embodiment, the first and second antioxidation films 16, 32 are provided between the first and second conductive films 14, 26 and between the third and fourth conductive films 30, 34, respectively. Thus it is possible to prevent oxidizer from diffusing through the oxide conductors of the second and third conductive films 26, 30 during the sidewall oxidation of the first and fourth conductive films 14, 34. Hence oxidation of poly-Si in the first and fourth conductive films 14, 34 can be prevented in the vicinity of the interface with the first and second antioxidation films 16, 32.

Furthermore, the HfAlO and other high dielectric constant insulating films have a weak binding force with O atoms. When a poly-Si or other conductive film is directly deposited on the HfAlO film for use as an electrode, the Si atom reacts with the O atom in HfAlO at the interface during the post-heating process. This reaction causes oxygen defects in HfAlO and increases leak current in the HfAlO film. In the embodiment, the second and third conductive films 26, 30 of oxide conductors are used between the interelectrode insulating film 28 and the first and fourth conductive films 14, 34 of poly-Si. Hence the occurrence of oxygen defects in the interelectrode insulating film 28 can be prevented, and the leak current can be reduced.

OTHER EMBODIMENTS

The invention has been described with reference to the above embodiment. However, the description and drawings constituting part of this disclosure should not be understood as limiting the present invention. Various alternative embodiments, examples, and practical applications will be apparent to those skilled in the art from this disclosure.

Figure 16:
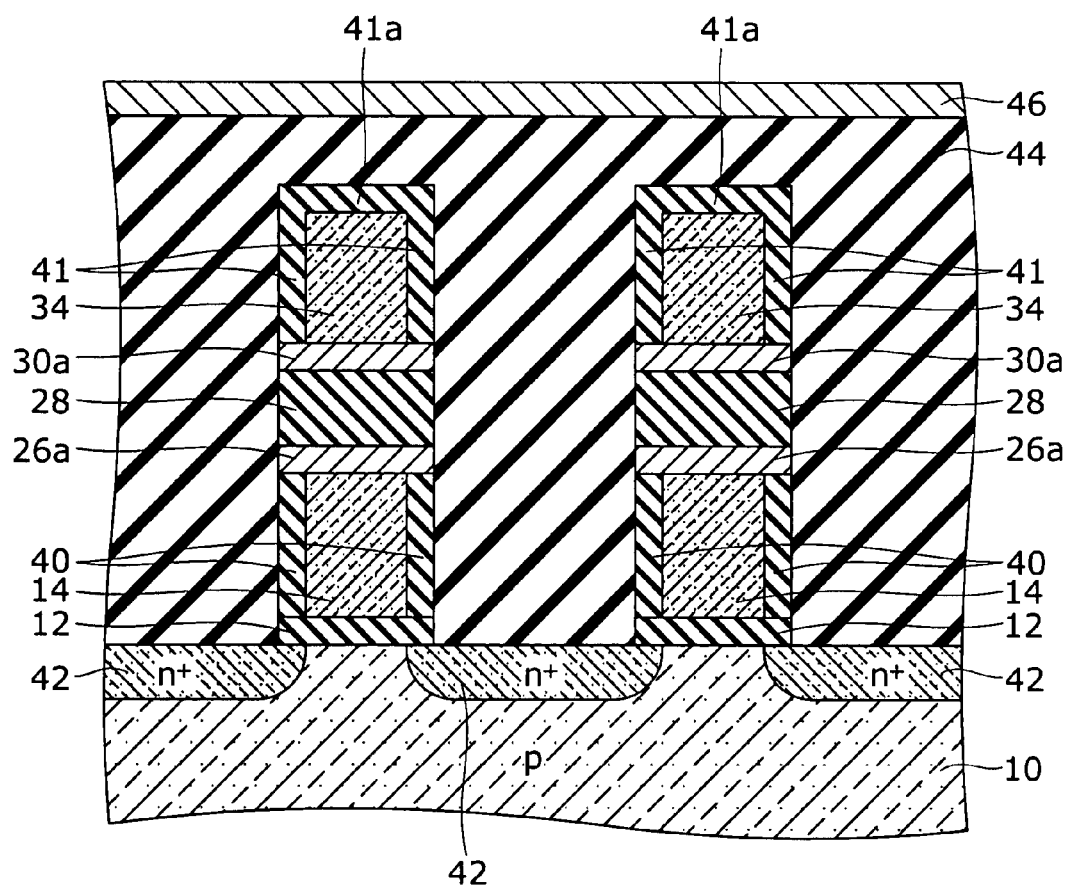
FIG. 16 is a cross-sectional view of a semiconductor memory device according to another embodiment of the invention.

For example, in the description of the embodiment, the second and third conductive films 26, 30 are made of oxide conductors. However, besides oxide conductors, the second and third conductive films 26, 30 can be made of platinum-group metals such as platinum (Pt), iridium (Ir), palladium (Pd), ruthenium (Ru), osmium (Os), and rhodium (Rh), or can have a laminated structure of oxide conductor and platinum-group metal. These platinum-group metals are resistant to oxidation. In particular, Pt is scarcely oxidized. Hence, when the second and third conductive films 26, 30 are made of Pt, the dimension of the second and third conductive films 26, 30 is scarcely varied even after the sidewall oxidation of the first and fourth conductive films 14, 34. Furthermore, because oxides of Ru and Ir are conductors, the second and third conductive films 26, 30 made thereof do not lose conductivity even if the sidewall is oxidized. Moreover, Pt can also be used for an antioxidation film. Hence, when the second and third conductive films 26, 30 are made of Pt, the first and second antioxidation films 16, 32 may be omitted, as shown in FIG. 16.

Figure 17:
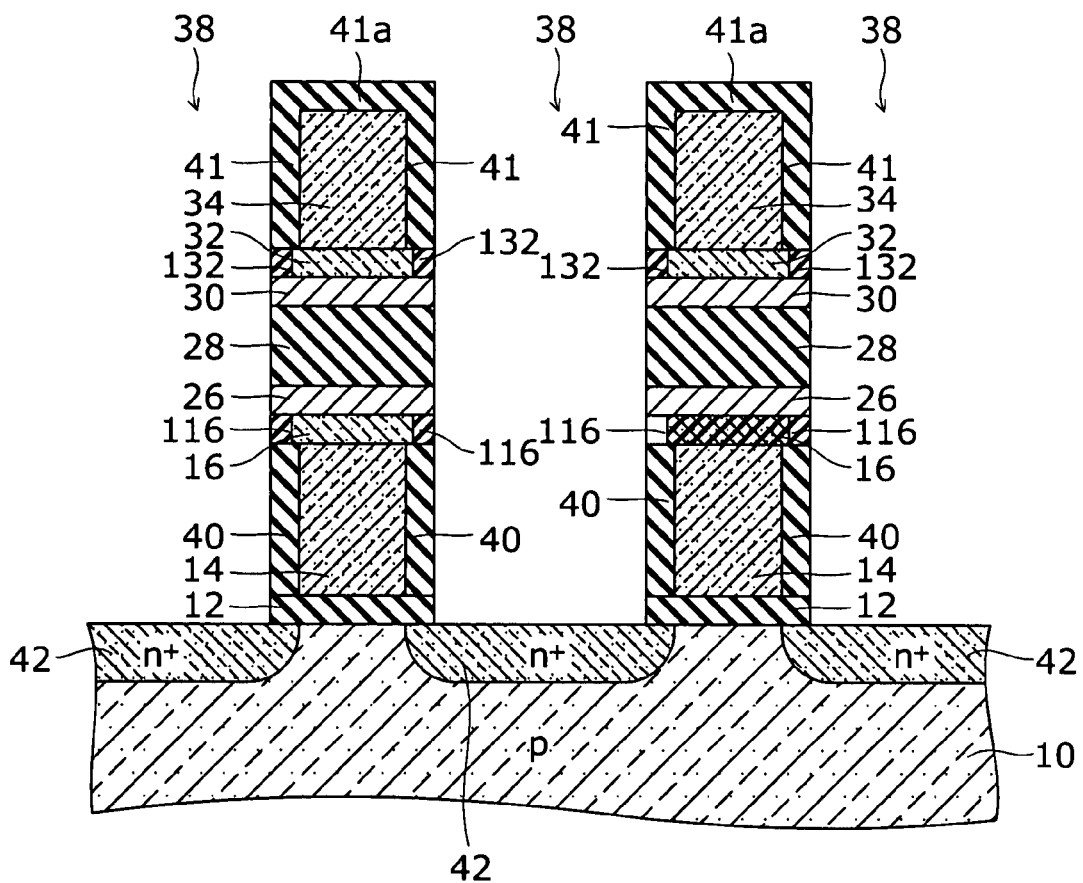
FIG. 17 is a cross-sectional view of a semiconductor memory device according to another embodiment of the invention.

The antioxidation films 16, 32 are intended for preventing oxidation due to reaction of the first and fourth conductive films 14, 34 of poly-Si with the second and third conductive films 26, 30 of oxide conductors. As shown in FIG. 17, during sidewall oxidation of the first and fourth conductive films 14, 34, the sidewall of the antioxidation films 16, 32 may be oxidized to form sidewall oxide films 116, 132, respectively, depending on the oxidation condition. However, even in this case, as is evident from the spirit of the invention, the intercell interference can be reduced to increase the coupling ratio and to ensure a sufficient amount of signal charge.

Furthermore, for the second and third conductive films 16, 32, a nitride compound film such as a silicon nitride (SiN) or a siliconoxynitride (SiON) film can be used in addition to a silicon oxide ($SiO_2$) film. In this case, a material which does not lose conductivity during a nitriding process or a material which is resistant to nitriding can be used for the second and third conductive films 16, 32.

In the description of the embodiment, the semiconductor substrate is assumed to be of p-type for simplicity. However, the semiconductor substrate can be of n-type without any problem. Clearly, the teachings of the semiconductor memory device and the method for manufacturing the same according to the embodiment remain applicable mutatis mutandis by reversing all the occurrences of p-type and n-type.

The embodiment is described with reference to a NAND nonvolatile semiconductor memory device (flash memory), and a method for manufacturing the same is illustratively described. However, the invention is similarly applicable to AND or DINOR flash memories other than NAND flash memories.

Thus it is understood that the present invention encompasses various embodiments not described herein. Therefore the scope of the invention is to be defined only by the elements recited in the accompanying claims, which are supported by the above description.

The invention claimed is:

1. A semiconductor memory device comprising a plurality of memory transistors each having:
    a floating gate electrode including, in a cross section taken along a bit line direction, a first conductive film in contact with a gate insulating film, first sidewall insulating films opposed to each other across the first conductive film, a second conductive film provided on the first sidewall insulating films and the first conductive film, and a first antioxidation film provided between the first and second conductive films, the first antioxidation film being in contact with the first and second conductive films;
    an interelectrode insulating film provided on the second conductive film; and
    a control gate electrode including a third conductive film provided on the interelectrode insulating film, a fourth conductive film provided on the third conductive film, and a second antioxidation film provided between the third and fourth conductive films, the second antioxidation film being in contact with the third and fourth conductive films,
    dimensions of the second and third conductive films along the bit line direction in a cross section being larger than a dimension of the first conductive film along the bit line direction in the cross section.

2. The semiconductor memory device according to claim 1, wherein the second and third conductive films are oxide conductive films.

3. The semiconductor memory device according to claim 1, wherein the second and third conductive films are made of a material selected from the group consisting of lanthanum nickel oxide ($LaNiO_3$), lanthanum titanium oxide ($LaTiO_3$), lanthanum cobalt oxide ($LaCoO_3$), strontium ruthenium oxide ($SrRuO_3$), ruthenium oxide ($RuO_2$), and iridium oxide ($IrO_2$).

4. The semiconductor memory device according to claim 1, wherein the second and third conductive films contain at least a platinum-group metal and a conductive oxide of the platinum-group metal.

5. The semiconductor memory device according to claim 1, wherein the second and third conductive films contain at least a material selected from the group consisting of platinum (Pt), iridium (Ir), palladium (Pd), ruthenium (Ru), osmium (Os), and rhodium (Rh), and an oxide conductor made of a material selected from the group consisting of platinum (Pt), iridium (Ir), palladium (Pd), ruthenium (Ru), osmium (Os), and rhodium (Rh).

6. The semiconductor memory device according to claim 1, wherein the first conductive film is made of polycrystalline silicon.

7. The semiconductor memory device according to claim 1, wherein the fourth conductive film includes a polycrystalline silicon or a polycrystalline silicon laminated with a layer made of a silicide including a material selected from the group consisting of tungsten (W), cobalt (Co), titanium (T), molybdenum (Mo) and nickel (Ni).

8. The semiconductor memory device according to claim 1, wherein the fourth conductive film is connected to a highly conductive metal film placed on the fourth conductive film, the highly conductive metal film including aluminum or copper, and the highly conductive metal film serving as a word line of the semiconductor memory device.

9. The semiconductor memory device according to claim 1, wherein the interelectrode insulating film includes a film made of a material selected from the group consisting of hafnium aluminate (HfAlO), zirconium aluminate (ZrAlO), lanthanum aluminate (LaAlO), strontium oxide (SrO), silicon nitride ($Si_3N_4$), aluminum oxide ($Al_2O_3$), magnesium oxide (MgO), yttrium oxide ($Y_2O_3$), hafnium oxide ($HfO_2$), zirconium oxide ($ZrO_2$), tantalum oxide ($Ta_2O_5$), and bismuth oxide ($Bi_2O_3$).

10. The semiconductor memory device according to claim 1, wherein the first sidewall insulating films are made of insulating materials including $SiO_2$.

11. The semiconductor memory device according to claim 1, wherein a thickness of the first sidewall insulating film is not smaller than 1 nm and not larger than the one-third of a width of the second conductive film.

12. The semiconductor memory device according to claim 1, wherein the first and second antioxidation films are made of a conductive film including silicon carbide (SiC).

13. The semiconductor memory device according to claim 1, wherein the first sidewall insulating films are made of a material selected from the group consisting of an inorganic insulating material including carbon (C) and fluorine (F) doped silicon monoxide (SiOC, SiOF), spin-on-glass (SOG) including hydrogen silsesquioxane polymer (HSQ), alkyl-silsesquioxane polymer (MSQ), hydrogen alkylsilsesquioxane polymer (HOSP), and organic silica, spin-on-dielectric (SOD) including polyarylene ether (PAE), benzocyclobutene (BCB), and polysilazane (PSZ) and materials obtained by porosifying these materials.

14. A semiconductor memory device comprising a plurality of memory transistors each having:
    a semiconductor substrate including a source region and a drain region provided on the surface of the semiconductor substrates being apart from each other;
    a gate insulating film provided on the semiconductor substrate between the source region and the drain region;
    a floating gate electrode provided on the gate insulating film, the floating gate electrode including a first conductive film in contact with the gate insulating film, a second conductive film provided on the first conductive film having a width of the second conductive film larger than a width of the first conductive film, and a first antioxidation film provided between the first and second conductive films, the first antioxidation film being in contact with the first and second conductive films;
    an interelectrode insulating film provided on the second conductive film; and
    a control gate electrode including a third conductive film provided on the interelectrode insulating film and a fourth conductive film provided on the third conductive film.

15. The semiconductor memory device according to claim 14, wherein a width of the third conductive film is larger than the width of the first conductive film.

16. The semiconductor memory device according to claim 14, wherein the second and third conductive films are made of a material selected from the group consisting of a platinum-group metal and a conductive oxide of the platinum-group metal, and the first conductive film is made of polycrystalline silicon.

* * * * *